(12) United States Patent
Allibert et al.

(10) Patent No.: US 11,974,505 B2
(45) Date of Patent: Apr. 30, 2024

(54) HYBRID STRUCTURE FOR SURFACE ACOUSTIC WAVE DEVICE AND ASSOCIATED PRODUCTION METHOD

(71) Applicant: Soitec, Bernin (FR)

(72) Inventors: Frédéric Allibert, Grenoble (FR); Christelle Veytizou, Bernin (FR)

(73) Assignee: Soitec, Bernin (FR)

( * ) Notice: Subject to any disclaimer, the term of this patent is extended or adjusted under 35 U.S.C. 154(b) by 679 days.

(21) Appl. No.: 17/044,132

(22) PCT Filed: Mar. 13, 2019

(86) PCT No.: PCT/FR2019/050540
§ 371 (c)(1),
(2) Date: Sep. 30, 2020

(87) PCT Pub. No.: WO2019/186011
PCT Pub. Date: Oct. 3, 2019

(65) Prior Publication Data
US 2021/0057635 A1    Feb. 25, 2021

(30) Foreign Application Priority Data

Mar. 30, 2018 (FR) ...................... 1852796

(51) Int. Cl.
*H03H 9/02*    (2006.01)
*H03H 3/10*    (2006.01)
(Continued)

(52) U.S. Cl.
CPC ........ *H10N 30/10516* (2023.02); *H03H 3/10* (2013.01); *H03H 9/02559* (2013.01);
(Continued)

(58) Field of Classification Search
CPC ............ H03H 9/1051; H03H 9/02559; H03H 9/02574; H03H 9/02834
See application file for complete search history.

(56) References Cited

U.S. PATENT DOCUMENTS

| 6,117,341 A | 9/2000 | Bray et al. |
| 2004/0013794 A1 | 1/2004 | Hashimoto et al. |

(Continued)

FOREIGN PATENT DOCUMENTS

| FR | 3047355 B1 | 4/2019 |
| JP | 2010-018514 A | 1/2010 |

(Continued)

OTHER PUBLICATIONS

Taiwanese Office Action and Search Report for Application No. 108108632 dated Apr. 11, 2022, 9 pages with translation.

(Continued)

*Primary Examiner* — Derek J Rosenau
(74) *Attorney, Agent, or Firm* — TraskBritt

(57) ABSTRACT

A hybrid structure for a surface acoustic wave device comprises a working layer of piezoelectric material assembled with a support substrate having a lower coefficient of thermal expansion than that of the working layer, and an intermediate layer located between the working layer and the support substrate. The intermediate layer is a sintered composite layer formed from powders of at least a first material and a second material different from the first.

6 Claims, 5 Drawing Sheets

(51) Int. Cl.
  *H10N 30/00* (2023.01)
  *H10N 30/079* (2023.01)
  *H10N 30/097* (2023.01)

(52) U.S. Cl.
  CPC .... *H03H 9/02574* (2013.01); *H03H 9/02834* (2013.01); *H10N 30/079* (2023.02); *H10N 30/097* (2023.02)

(56) References Cited

U.S. PATENT DOCUMENTS

| | | |
|---|---|---|
| 2014/0091677 A1 | 4/2014 | Noda et al. |
| 2015/0365067 A1 | 12/2015 | Hori et al. |
| 2017/0087593 A1 | 3/2017 | Kobayashi et al. |
| 2019/0036007 A1* | 1/2019 | Kononchuk .............. H03H 3/02 |
| 2022/0158080 A1 | 5/2022 | Kononchuk et al. |

FOREIGN PATENT DOCUMENTS

| | | |
|---|---|---|
| JP | 2015-073331 A | 4/2015 |
| TW | 201638046 A | 11/2016 |
| WO | 2013/021614 A1 | 2/2013 |
| WO | 2017/134357 A1 | 8/2017 |
| WO | 2017/163722 A1 | 9/2017 |
| WO | 2017/163729 A1 | 9/2017 |

OTHER PUBLICATIONS

Japanese Office Action for Japanese Application No. 2020-543227 dated Apr. 25, 2023, 6 pages.
European Extended Search Report and Opinion for European Application . No. 21217508, dated May 17, 2022, 5 pages.
Singapore Written Opinion for Application No. 11202009517Q dated Mar. 3, 2023, 19 pages.
Abbot et al., Characterization of Bonded Wafer for RF Filters with Reduced TCF, Proc. 2005 IEEE International Ultrasonics Symposium, (Sep. 19-21, 2005), pp. 926-929.
Hashimoto et al., Recent Development of Temperature Compensated SAW Devices, 2011 IEEE International Ultrasonics Symposium Proceedings,, (2011), pp. 79-86.
International Search Report for International Application PCT/FR2019/050540 dated Jun. 25, 2019, 2 pages.
International Written Opinion for International Application PCT/FR2019/050540 dated Jun. 25, 2019, 4 pages.
Japanese Notice of Reasons for Refusal for Japanese Application No. 2020-543227, dated Oct. 31, 2023, 7 pages with English translation.

\* cited by examiner

| Material | Longitudinal wave acoustic velocity (VL) (m/s) | Density ρ (g/cm3) | Acoustic impedance (x1E6) (kg/(m2.s)) | Resistivity (ohm.cm) | Permitivity |
|---|---|---|---|---|---|
| SiO2 | 6000 | 2.2 | 13.20 | 1.00E+17 | 3.9 |
| Si | 8430 | 2.34 | 19.70 | 250000 | 11.7 |
| Ge | 5410 | 5.47 | 29.60 | | |
| Si3N4 | 9900 | 2.20 | 21.78 | 1e10 - 1e15 | 9.5-10.5 |
| SiC | 13000 | 13.80 | 91.80 | 1E2-1E6 | |
| Al2O3 | 10520 | 3.86 | 40.60 | >1E14 | 9.8 |
| Sapphire, aluminium oxide | 11100 | 3.99 | 44.30 | | |
| Zirconium | 4650 | 6.48 | 30.10 | | |

| Material | Longitudinal wave acoustic velocity (VL) (m/s) | Density ρ (g/cm3) | Acoustic impedance (x1E6) (kg/(m2.s)) |
|---|---|---|---|
| AlN | 11000 | 3.27 | 36.00 |
| LTO | 6000 | 7.46 | 44.76 |
| LNO | 7000 | 4.64 | 32.48 |

HYBRID STRUCTURE FOR SURFACE ACOUSTIC WAVE DEVICE AND ASSOCIATED PRODUCTION METHOD

CROSS-REFERENCE TO RELATED APPLICATIONS

This application is a national phase entry under 35 U.S.C. § 371 of International Patent Application PCT/FR2019/050540, filed Mar. 13, 2019, designating the United States of America and published as International Patent Publication WO 2019/186011 A1 on Oct. 3, 2019, which claims the benefit under Article 8 of the Patent Cooperation Treaty to French Patent Application Serial No. 1852796, filed Mar. 30, 2018.

TECHNICAL FIELD

The present invention relates to the field of surface acoustic wave devices. It relates, in particular, to a hybrid structure suitable for the manufacture of surface acoustic wave devices.

BACKGROUND

The structures of acoustic resonators such as surface acoustic wave (SAW) devices use one or more interdigital transducers produced on a piezoelectric substrate in order to convert electrical signals into acoustic waves and vice versa. Such SAW devices or resonators are often used in filter applications. Radiofrequency (RF) SAW technology provides excellent performance such as a high isolation and low insertion losses. For this reason, it is used for RF duplexers in wireless communication applications.

The improvement in the performance of RF SAW devices comes, in particular, through obtaining a frequency response that is stable with respect to the temperature. The dependency of the operating frequency of SAW devices with respect to the temperature, or the temperature coefficient of frequency (TCF), depends on the one hand on the variations in spacing between the interdigitated electrodes of the transducers, which are generally due to the relatively high coefficients of thermal expansion (CTE) of the piezoelectric substrates used; on the other hand, the TCF depends on the temperature coefficient of velocity since the expansion or contraction of the piezoelectric substrate is accompanied by an increase or a decrease in the velocity of the surface acoustic wave. To minimize the temperature coefficient of frequency (TCF), one objective is therefore to minimize the expansion/contraction of the piezoelectric substrate, in particular, in the surface zone in which the acoustic waves will propagate.

The article by K. Hashimoto, M. Kadota et al., "Recent development of temperature compensated SAW devices," IEEE Ultrason. Symp. 2011, pages 79 to 86, 2011, gives an overview of the approaches commonly used to overcome the problem of dependency, with respect to the temperature, of the frequency response of SAW devices.

One advantageous approach involves using a hybrid substrate, for example, composed of a layer of piezoelectric material positioned on a silicon substrate. The low CTE of the silicon makes it possible to limit the expansion/contraction of the piezoelectric layer in relation to temperature. In the case of a piezoelectric layer of lithium tantalate ($LiTaO_3$), the abovementioned article indicates that a ratio of 10 between the thickness of $LiTaO_3$ and the thickness of the silicon substrate makes it possible to suitably improve the temperature coefficient of frequency (TCF). One of the drawbacks of this approach comes from the presence of parasitic acoustic waves (referred to as "spurious acoustic modes" in the article "Characterization of bonded wafer for RF filters with reduced TCF," B. P. Abbott et al., Proc. 2005 IEEE International Ultrasonics Symposium, Sep. 19-21, 2005, pp. 926-929) which have a negative impact on the frequency characteristics of the resonator produced on the hybrid substrate. These parasitic resonances are, in particular, linked to parasitic reflections of the main acoustic wave (propagating mainly in a surface zone of the $LiTaO_3$ layer) on the underlying interfaces, including, in particular, the interface between the $LiTaO_3$ and the silicon. One solution for reducing these parasitic resonances is to increase the thickness of the $LiTaO_3$ layer; since this entails also increasing the thickness of the Si substrate in order to retain the improvements in the TCF, the total thickness of the hybrid substrate is no longer compatible with the requirements of thickness reduction of the final components, in particular, for catering to the mobile phone market. Another solution, proposed by K. Hashimoto et al. (abovementioned article) is to roughen the lower surface of the $LiTaO_3$ layer (at the bonding interface with the substrate) so as to limit the reflections of the acoustic wave thereon.

BRIEF SUMMARY

One objective of the present disclosure is to provide an alternative solution to the solutions of the prior art. One objective of the present disclosure is, in particular, to provide a hybrid structure that enables the reduction and/or the elimination of the parasitic acoustic waves.

The present disclosure relates to a hybrid structure for a surface acoustic wave device comprising a working layer of piezoelectric material assembled with a support substrate having a lower coefficient of thermal expansion than that of the working layer, and an intermediate layer located between the working layer and the support substrate. The hybrid structure is notable in that the intermediate layer is a sintered composite layer, formed from powders of at least a first material and a second material different from the first.

According to advantageous features of the present disclosure, taken alone or in combination:

the first material has a similar acoustic impedance to that of the working layer; the ratio between the acoustic impedance of the working layer and the acoustic impedance of the second material is greater than 2; and the mean size of the particles of the powders of the first and the second material is greater than or equal to a quarter of the wavelength of the acoustic signal intended to propagate at the surface of the surface acoustic wave device.

the first material and the second material are selected so as to form an acoustic impedance matching layer between the working layer and the support substrate; the mean size of the particles of the powders of the first and the second material is less than a quarter of the wavelength of the acoustic signal intended to propagate at the surface of the surface acoustic wave device.

the support substrate comprises a material selected from silicon, glass, silica, sapphire, alumina, aluminum nitride.

the working layer comprises a piezoelectric material selected from lithium tantalate ($LiTaO_3$), lithium niobate ($LiNbO_3$), quartz, zinc oxide (ZnO).

the first and second materials are selected from silicon oxide, silicon nitride, silicon, silicon carbide, alumina, germanium, sapphire, zirconium.

the composite layer has a thickness of between a few hundred of nanometers and several tens of microns.

The present disclosure also relates to a process for manufacturing a hybrid structure for a surface acoustic wave device comprising the following steps:

i) providing a working layer of piezoelectric material and a support substrate having a lower coefficient of thermal expansion than that of the working layer;

ii) depositing a layer formed from a mixture of powders of at least a first material and a second material, different from the first, on a first face of the working layer and/or on a first face of the support substrate;

iii) sintering the layer formed from the mixture of powders to obtain a sintered composite layer firmly attached to the first face of the working layer and/or to the first face of the support substrate;

iv) assembling the working layer and the support substrate, so that the composite layer is positioned between the working layer and the support substrate.

According to advantageous features of the present disclosure, taken alone or in combination:

the first face of the working layer and/or the first face of the support substrate comprises a protective layer, prior to the deposition of the layer formed from the mixture of powders from step ii).

the protective layer is formed by at least one material selected from silicon nitride, a silicon oxynitride, a silicon oxide and alumina.

the mixture of powders is in the form of a viscous paste, and the deposition of the layer formed by the mixture in step ii) is carried out by spin coating.

the deposition of the layer formed by the mixture of powders is followed by a low-temperature heat treatment in order to discharge at least one liquid component of the viscous paste.

a bonding layer is deposited on the sintered composite layer, prior to the assembly step iv).

the working layer provided in step i) is a piezoelectric material donor substrate.

the manufacturing process comprises a step v) of thinning the donor substrate to the desired thickness of the working layer for the manufacture of the acoustic wave device.

BRIEF DESCRIPTION OF THE DRAWINGS

Other features and advantages of the present disclosure will become apparent from the following detailed description, with reference to the appended figures, in which.

DETAILED DESCRIPTION

In the descriptive section, the same references as in the figures may be used for elements of the same nature. The figures are schematic representations, which, for the sake of legibility, are not to scale. In particular, the thicknesses of the layers along the z-axis are not to scale with respect to the lateral dimensions along the x- and y-axes.

The present disclosure relates to a hybrid structure 10 suitable for the manufacture of surface acoustic wave (SAW) devices; it is, in particular, suitable for the manufacture of devices having a frequency within the range from a few tens of MHz to a few tens of GHz.

Figures 1, 2A, 2B:
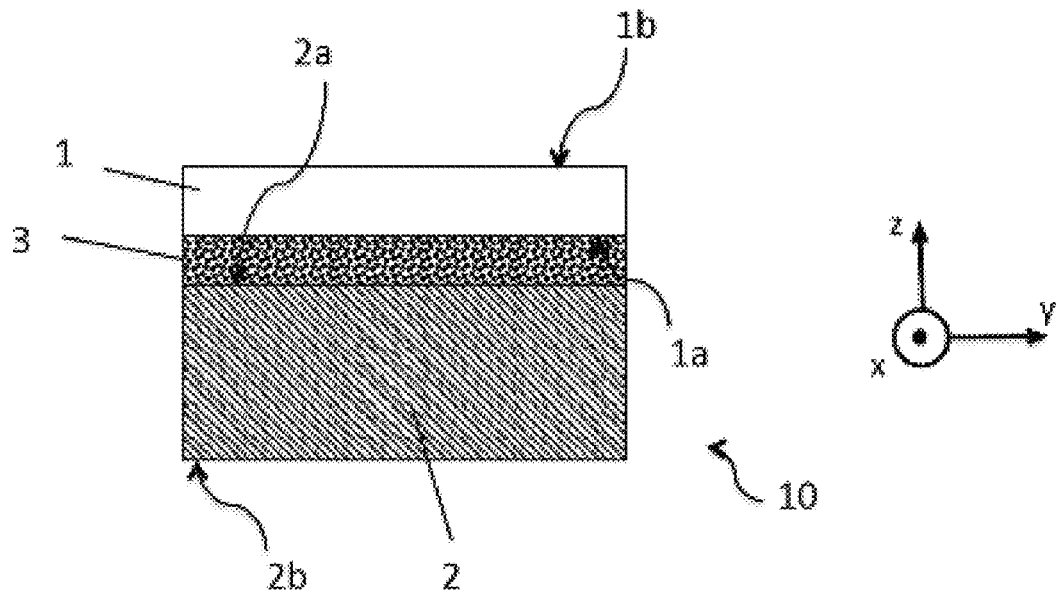
FIG. 1 presents a hybrid structure in accordance with the present disclosure.
FIG. 2A a presents a list of suitable materials for forming a sintered composite layer of a hybrid structure in accordance with the present disclosure.
FIG. 2B presents a list of materials for forming a working layer of a hybrid structure in accordance with the present disclosure.

The hybrid structure 10 according to the present disclosure comprises a working layer 1 of piezoelectric material, having a first face 1a and a second face 1b, as illustrated in FIG. 1. The working layer 1 is thus named since it will be used for the subsequent production of surface acoustic wave devices. By way of example, the working layer 1 of the hybrid structure 10 could be composed of a material selected from the group: lithium tantalate $LiTaO_3$ (LTO in FIG. 2B), lithium niobate $LiNbO_3$ (LNO in FIG. 2B), aluminum nitride AlN (FIG. 2B), zinc oxide (ZnO).

The hybrid structure 10 also includes an intermediate layer 3 positioned under the working layer 1 (along the z-axis represented in FIG. 1). The intermediate layer is a sintered composite layer 3, formed from powders of at least two different materials. A sintered layer is understood to mean a layer resulting from the consolidation of a mixture of powders: this consolidation is obtained by input of thermal energy and optionally mechanical energy, but without melting at least one of the pulverulent materials of the mixture. The sintered nature of the composite layer may therefore be detected by structural analysis of the layer (for example, by scanning electron microscopy). The particles or grains of the powders of materials appear welded together and the density of the composite layer depends on the degree of compaction of the mixture during the input of energy for the consolidation.

The particles forming the powder of each of the materials of the sintered composite layer 3 have dimensions that follow a typically Gaussian distribution. In the remainder of the description, the mean size of the particles will be likened to the equivalent mean diameter of the particles of a given material. The mean size of the particles may typically vary between a few tens of nanometers and a few microns.

The sintered composite layer 3 may, in particular, be formed from at least a first and a second material, selected from silicon oxide, silicon nitride, silicon, silicon carbide, alumina, germanium, sapphire, zirconium, certain properties of which are indicated in FIG. 2A.

The sintered composite layer 3 may optionally comprise three or more different materials.

The sintered composite layer 3 has, depending on the embodiments, a thickness of between a few hundred of nanometers and several microns.

Finally, the hybrid structure 10 comprises a support substrate 2 having a lower coefficient of thermal expansion than that of the working layer 1, positioned under the composite layer 3 (along the z-axis represented in FIG. 1), making it possible to limit the expansion/contraction of the working layer 1 in relation to temperature (and thus to improve the temperature coefficient of frequency of the devices, which will be produced on the working layer 1).

The support substrate 2 could, in particular, be composed of a material selected from the group: silicon, III-V semiconductors, silicon carbide, glass, sapphire.

Figure 3A:
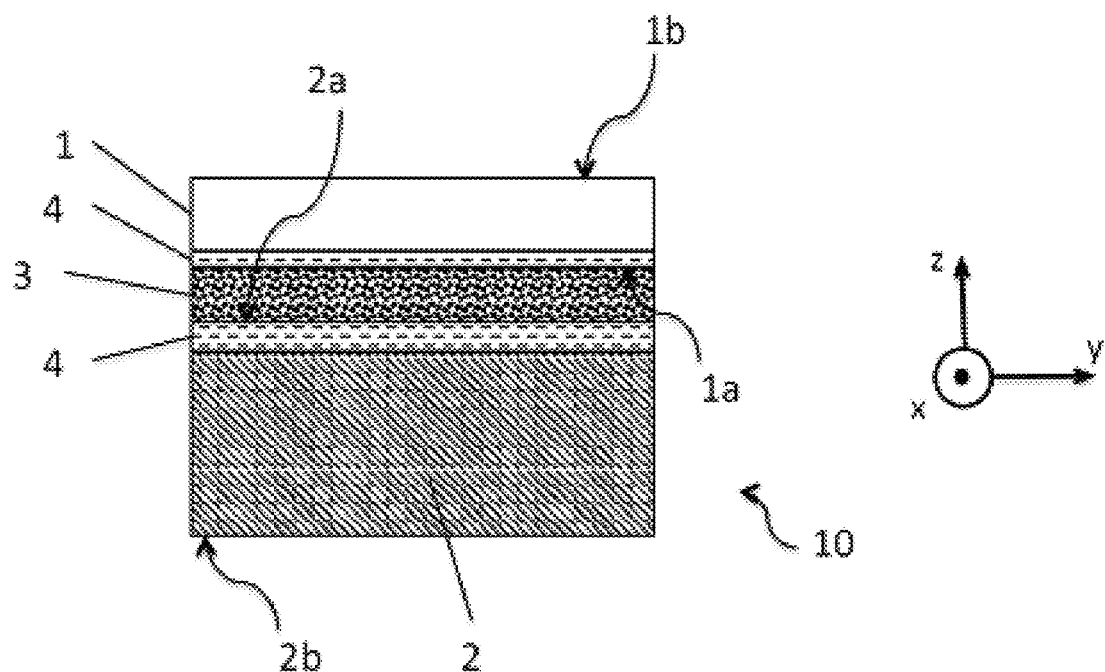
FIGS. 3A and 3B present hybrid structures in accordance with the present disclosure.
Figure 3B:
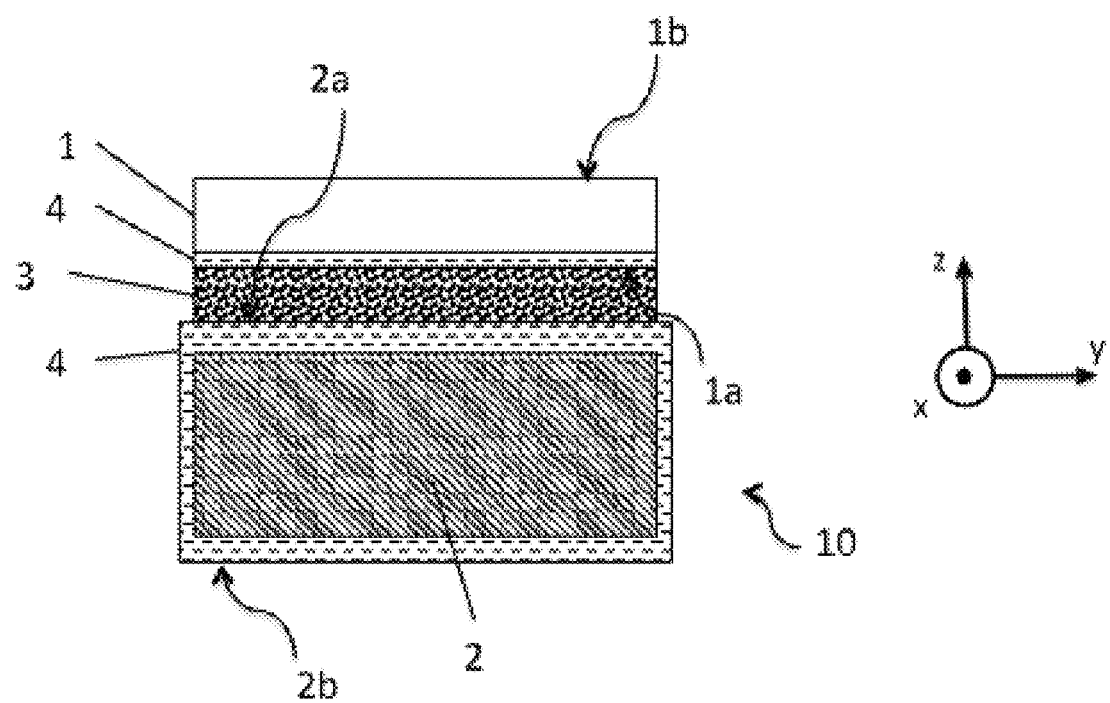

As illustrated in FIGS. 3A and 3B, the hybrid structure 10 preferentially comprises additional layers 4 positioned on the first face 1a of the working layer 1 and/or on the first face 2a of the support substrate 2, and potentially on the second face 2b of the support substrate 2 and on the edges of the substrate 2 (FIG. 3B ). As will be seen during the description of the process for manufacturing the hybrid structure 10, these additional layers 4, in particular, have a role of protecting the support substrate 2 and/or the working layer 1 against the diffusion of impurities contained in the sintered composite layer 3 or present during the production of the layer 3.

Figure 4:
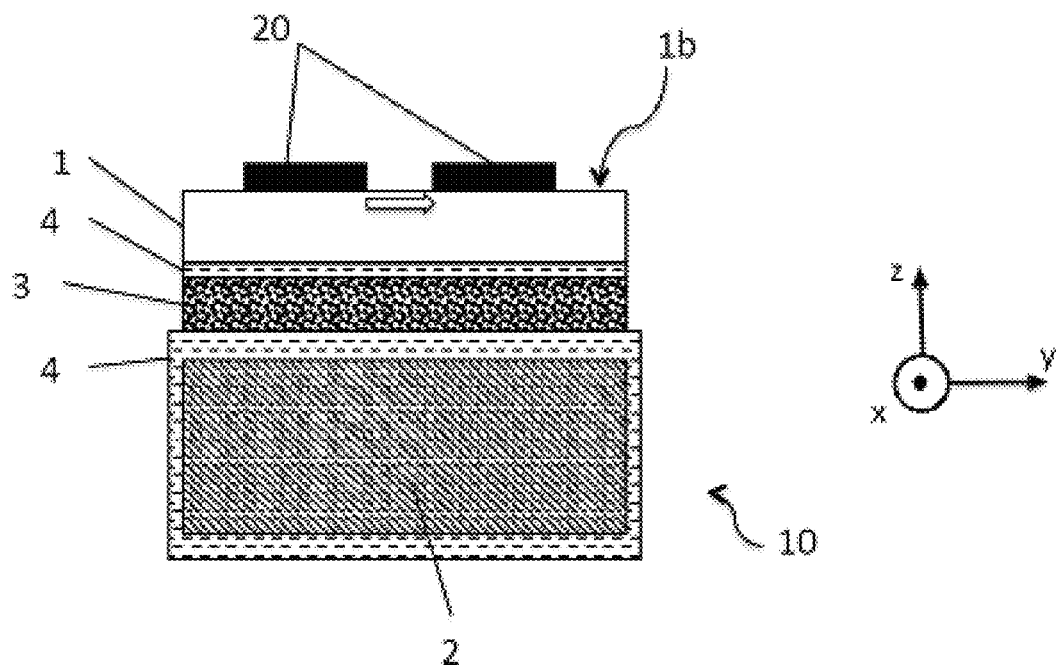
FIG. 4 presents a hybrid structure in accordance with the present disclosure, comprising a SAW device.

The hybrid structure 10 according to the present disclosure is suitable for the manufacture of surface acoustic wave (SAW) devices, in particular, comprising metal electrodes 20 on the working layer 1, between which an acoustic signal (depicted by the white arrow in FIG. 4) propagates, in the (x,y) plane, close to the surface of the second face 1b of the working layer 1.

According to a first embodiment of the hybrid structure 10 of the present disclosure, the sintered composite layer 3 is configured to maximize the diffusion of an incident acoustic wave, resulting from the acoustic signal and which would propagate in the volume of the working layer 1, to the composite layer 3.

For this, in the sintered composite layer 3, formed from powders of at least a first and a second material, the first material has a similar acoustic impedance to that of the working layer 1. The term similar is understood to mean having a maximum deviation of ±20% around the acoustic impedance value of the working layer 1, and preferentially a deviation of less than ±15%, or even ±10%. By way of example, for a working layer 1 made of $LiTaO_3$, the first material may be alumina, the acoustic impedance of which ($40.6 \times 10^6$ Pa·s/m) is substantially the same as that of the lithium tantalate ($44.8 \times 10^6$ Pa·s/m).

Furthermore, the ratio between the acoustic impedance of the working layer 1 and the acoustic impedance of the second material of the sintered composite layer 3 is selected to be greater than or equal to 2, so as to guarantee a reflection coefficient of more than 10%. By way of example, if the first material is lithium tantalate ($44.8 \times 10^6$ Pa·s/m), the second material could be $SiO_2$, the acoustic impedance of which is $13.2 \times 10^6$ Pa·s/m, making it possible to obtain a reflection coefficient on the order of 30% at the interface between the particles of the composite layer 3, and producing reflections in multiple directions (diffusion).

Finally, the size of the particles of the powders of the first and the second material is greater than or equal to a quarter of the wavelength of the incident acoustic wave. This feature ensures that the incident acoustic wave can be subjected to the influence of the particles. For example, for an incident acoustic wave that has a wavelength of around 6 microns (i.e., a frequency of around 1 GHz), the mean size of the particles will be selected to be around 2 microns. The sintered composite layer 3 then has a thickness greater than 5 microns, or even greater than 10 microns.

If an additional layer 4 is present between the working layer 1 and the composite layer 3, the additional layer 4 will have to have an acoustic impedance close to that of the working layer 1, in order to limit the parasitic reflections between these two layers. For a working layer 1 made of $LiTaO_3$, use could, for example, be made of alumina, the acoustic impedance of which ($40.6 \times 10^6$ Pa·s/m) is close to that of the $LiTaO_3$, which results in a reflection of less than 0.5%.

The sintered composite layer 3 according to the first embodiment makes it possible to diffuse the incident wave in a multitude of directions, and thus greatly limits the component reflected toward the electrodes 20 of the surface acoustic wave device.

According to a second embodiment of the hybrid structure 10 of the present disclosure, the sintered composite layer 3 is configured to maximize the transmission of an incident acoustic wave, resulting from the acoustic signal and which would propagate in the volume of the working layer 1, to the composite layer 3.

For this, in the sintered composite layer 3, formed from powders of at least a first and a second material, the first material and the second material are selected so as to form an acoustic impedance matching layer between the working layer 1 and the support substrate 2. Forming an acoustic impedance matching layer implies that the mean acoustic impedance of the composite layer 3 is substantially equal to the square root of the product of the acoustic impedances of the working layer 1 and of the support substrate 2:

$$Z_{composite\ layer} \approx \sqrt{Z_{working\ layer} \times Z_{substrate}}$$

It should be remembered that the acoustic impedance Z of a material is expressed as:

$$Z = v \times \rho$$

where $v$ is the velocity of the acoustic wave in the material, $\rho$ is the density of the material.

In the case of the composite layer 3, the volume fractions $V_1$ and $V_2$ of each of the materials forming it are considered; it is thus possible to evaluate its acoustic impedance (in the case of two materials) from the expression:

$$Z_{composite\ layer} = (v_1 \times V_1 + v_2 \times V_2) \times (\rho_1 \times V_1 + \rho_2 \times V_2)$$

where $\rho_1$ and $\rho_2$ are, respectively, the density of the first and the second material, $v_1$ and $v_2$ are, respectively, the velocity of the acoustic wave in the first and the second material.

The volume fractions $V_1$ and $V_2$ are defined by the proportion of each of the materials in the composite layer 3.

By way of example, the first material could be $Al_2O_3$ and the second material $SiO_2$, present in the composite layer in proportions of 65% and 35%, respectively. The impedance of the composite layer 3 could thus be on the order of $30 \times 10^6$ Pa·s/m.

Furthermore, according to this second embodiment, the mean size of the particles of the powders of the first and the second material is less than a quarter of the wavelength of the incident acoustic wave. This feature ensures that the incident acoustic wave sees the composite layer as a virtually homogeneous medium. By way of example, for an incident acoustic wave that has a wavelength of around 7.5 microns (i.e., a frequency of around 800 MHz), the mean size of the particles could be selected to be around 0.5 microns. The sintered composite layer 3 could have a thickness of a few microns.

If an additional layer 4 is present between the working layer 1 and the composite layer 3, the additional layer 4 will have to have an acoustic impedance close to that of the working layer 1, in order to limit the parasitic reflections between these two layers. For a working layer 1 made of $LiTaO_3$, use could, for example, be made of alumina, the acoustic impedance of which ($40.6 \times 10^6$ Pa·s/m) is close to that of the $LiTaO_3$, which results in a reflection of less than 0.5%.

If an additional layer 4 is present between the composite layer 3 and the support substrate 2, this additional layer 4 will have to have an acoustic impedance close to that of the support substrate 2, in order to limit the parasitic reflections at the additional layer/support substrate interface. For a support substrate made of Si, use could, for example, be made of silicon nitride, the acoustic impedance of which (~22×10$^6$ Pa·s/m) is close to that of the Si, which results in a reflection of less than 0.5%.

The sintered composite layer 3 according to the second embodiment makes it possible to favor the transmission (by acoustic impedance matching), from the working layer 1 to the substrate 2, of the incident acoustic wave that is customarily reflected at the interfaces of a hybrid structure: it therefore makes it possible to reduce the parasitic reflections having a negative impact on the frequency characteristics of the SAW device produced on the hybrid structure 10.

According to a variant applicable to the various described embodiments of the hybrid structure 10, the sintered composite layer 3 has good dielectric properties (resistivity greater than 1E7 ohms·cm) and a low equivalent permittivity (typically less than 11 F/m, permittivity of silicon), so as to provide an electrical insulation equivalent to several microns of silicon oxide. Such a sintered composite layer 3 may, in particular, improve the linearity of the surface acoustic wave device in the field of radiofrequencies.

According to another variant applicable to the various described embodiments of the hybrid structure 10, the sintered composite layer 3 has mobile electric charge trapping properties. This feature makes it possible to trap and therefore neutralize the electric charges that may appear in the upper portion of the support substrate 2 owing to the presence of fixed charges in one of the upper layers (additional layer 4 or working layer 1). In order to have this trapping feature, one of the materials making up the particles of the composite layer 3 could be silicon.

Figure 5A:
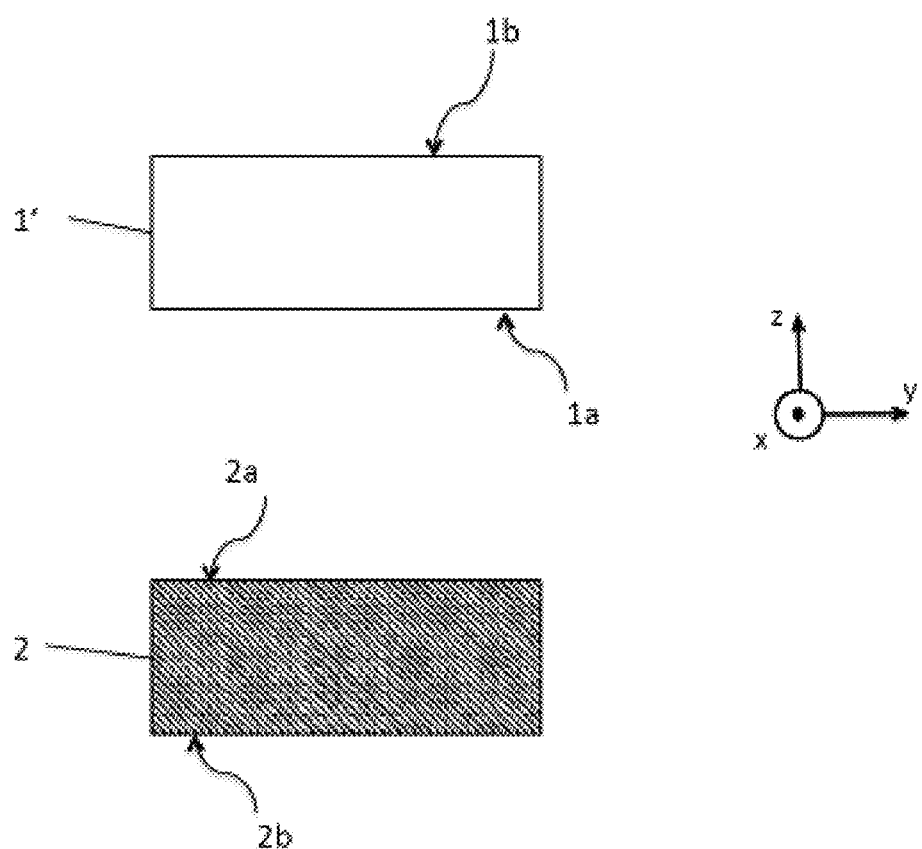
FIGS. 5A to 5E present a process for manufacturing a hybrid structure in accordance with the present disclosure.

The present disclosure also relates to a process for manufacturing a hybrid structure 10 for a surface acoustic wave device. The process comprises a first step (denoted by i)) of providing a working layer 1 of piezoelectric material. According to one advantageous embodiment, the working layer 1 is in the form of a piezoelectric material donor substrate 1', of standard thickness and diameter for the microelectronics industry (FIG. 5A).

The first step also comprises the provision of a support substrate 2 having a lower coefficient of thermal expansion than that of the donor substrate 1' (i.e., also lower than that of the working layer 1).

Figure 5B:
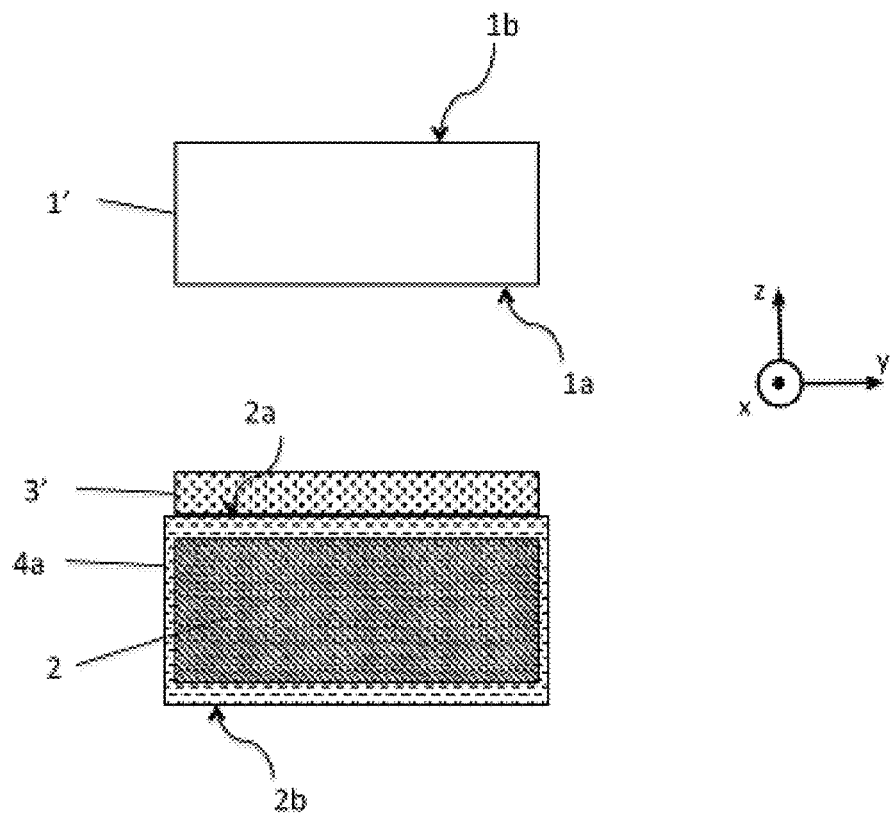

The manufacturing process according to the present disclosure comprises a second step (denoted by ii)) that comprises depositing a layer 3' formed from a mixture of powders of at least a first material and a second material different from the first, on a first face 1a of the working layer 1 (or of the donor substrate 1') and/or on a first face 2a of the support substrate 2. In the example illustrated in FIG. 5B, the layer 3' of a mixture of powders is deposited on the first face 2a of the support substrate 2. The layer 3' could be deposited on the first face 1a of the working layer 1; it could also be deposited on each of the first faces 1a, 2a, respectively, of the working layer 1 and of the support substrate 2.

Advantageously, the first face 2a of the support substrate 2 comprises a protective layer 4a produced prior to the deposition of the layer 3' of a mixture of powders. The protective layer 4a could even completely encapsulate the support substrate 2, i.e., cover the second face 2b thereof and the edge thereof.

Alternatively, if the layer 3' of a mixture of powders is deposited on the working layer 1 (or the donor substrate 1'), a protective layer will be deposited at least on the first face 1a of the working layer 1 (or of the donor substrate 1').

Preferentially, the protective layer 4a is formed by at least one material selected from silicon nitride, a silicon oxynitride, silicon oxide, alumina. It may be produced by various known chemical deposition techniques. It makes it possible to avoid or at least to limit the diffusion of impurities contained in the layer 3' into the support substrate 2 (or the working layer 1).

According to a first embodiment variant, the mixture of powders is in the form of a viscous paste.

Such a paste is customarily obtained by adding a liquid compound, of solvent type (in particular, alcohol, for example, ethanol), to the dry mixture of powders. Typically, the powders used contain particles having a mean size between a few tens of nanometers and a few microns.

Alternatively, the mixture of powders may be incorporated into a matrix of polymer type based on silicon (PDC for polymer-derived ceramics), capable of being converted into ceramic at high temperature. It is noted that in the case of a layer 3' with PDC matrix, the sintered composite layer 3, which will be obtained subsequently will comprise the first and the second material originating from the mixture of powders, but also silicon originating from the conversion into ceramic of the matrix.

The deposition of the layer 3' formed by the mixture in step ii) is preferentially carried out by spin coating (or dip coating) or screenprinting through a mask.

The viscosity of the paste is adjusted by the powders/liquid compound (solvent and/or polymer) ratio. It is selected in order to enable a uniform deposition of the layer 3', at thicknesses that may range from a few hundreds of nanometers to several microns.

The deposition of the layer 3' is followed by a heat treatment at low temperatures (for example, between 150° C. and 400° C.) making it possible to discharge the solvent(s) from the layer 3' and to avoid any subsequent degassing during the process, in particular, after the assembly step (described below).

According to a second embodiment variant, the mixture of powders is in a pulverulent dry form and is deposited as a layer 3' on the first face 2a of the support substrate 2 (or alternatively on the face 1a of the donor substrate 1'). The shaping of this layer 3' may be carried out by compression molding or hot isostatic pressing. In both cases, a compressive stress is applied to the layer 3' to firmly attach the particles of the powders of the mixture to one another and to the first face 2a. A specific tool is needed to hold the pulverulent mixture on the substrate and to apply a uniform compressive stress to the entire surface of the substrate.

Figure 5C:
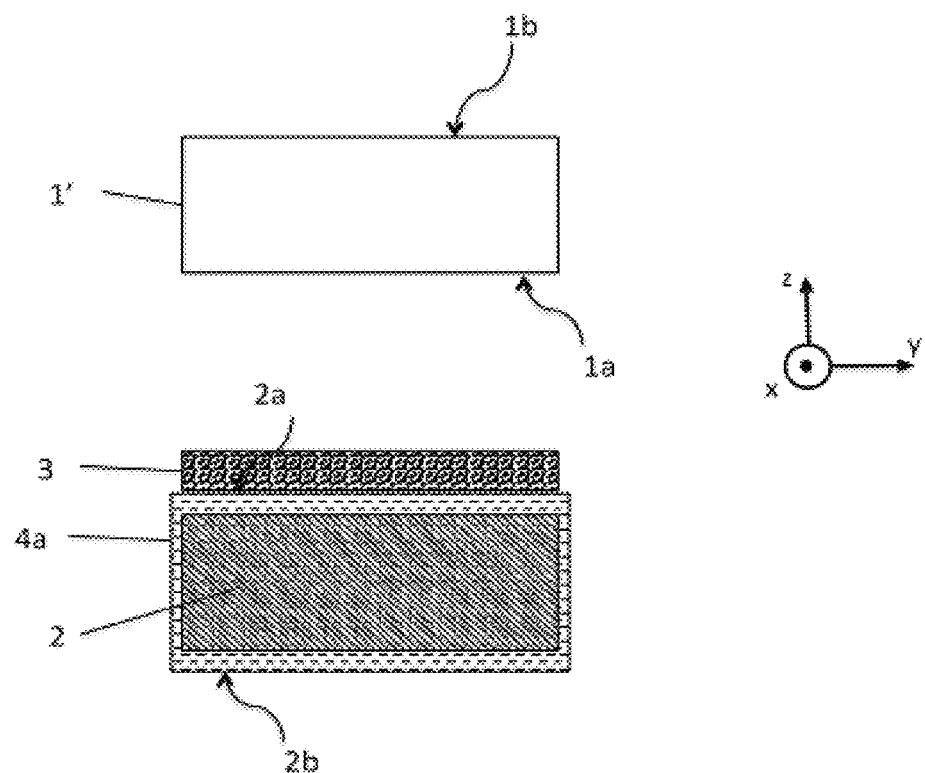

The manufacturing process according to the present disclosure comprises a third step (denoted by iii)) comprising the sintering of the layer 3' formed from the mixture of powders, in order to obtain a sintered composite layer 3 firmly attached to the first face 2a of the support substrate 2 (FIG. 5C).

The sintering is customarily performed at high temperatures, typically above 1000° C., for a duration that may range from a few hours to around 24 hours. The sintering temperature nevertheless remains below the melting point of at least one of the powders contained in the layer 3'. Under the effect of the heat, the particles of the powders are welded together, which forms the cohesion of the resulting composite layer 3. The composite layer 3 is also firmly attached to the first face 2a of the support substrate 2.

Optionally, the sintering may in addition be carried out under mechanical stress, which makes it possible to further compact the composite layer 3.

The sintered composite layer 3 is thus composed at least of particles of the first and the second material. Between the particles, depending on the degree of compaction, there may be more or fewer empty interstices (or interstices containing the ceramic resulting from a PDC matrix). Depending on the particle size distribution, the volume fraction of these interstices could reach 50%, and more preferentially be kept below 25%, or even below 15%, in particular, to ensure a good mechanical strength of the composite layer 3. For the sake of simplification, this volume fraction of interstices has not been taken into account in the embodiments of the hybrid structure 10 described above; it could be considered as a third material, in addition to the first and second materials forming the particles.

The thickness of the layer 3' deposited in step ii) is selected so as to obtain a desired thickness of sintered composite layer 3. Indeed, depending on the type of layer 3' deposited (in form of paste with solvent and/or polymer or in dry form), the reduction in thickness during the sintering step will be greater or lesser. A reduction in volume of the layer 3' on the order of 10 to 30% may take place.

Figure 5D:
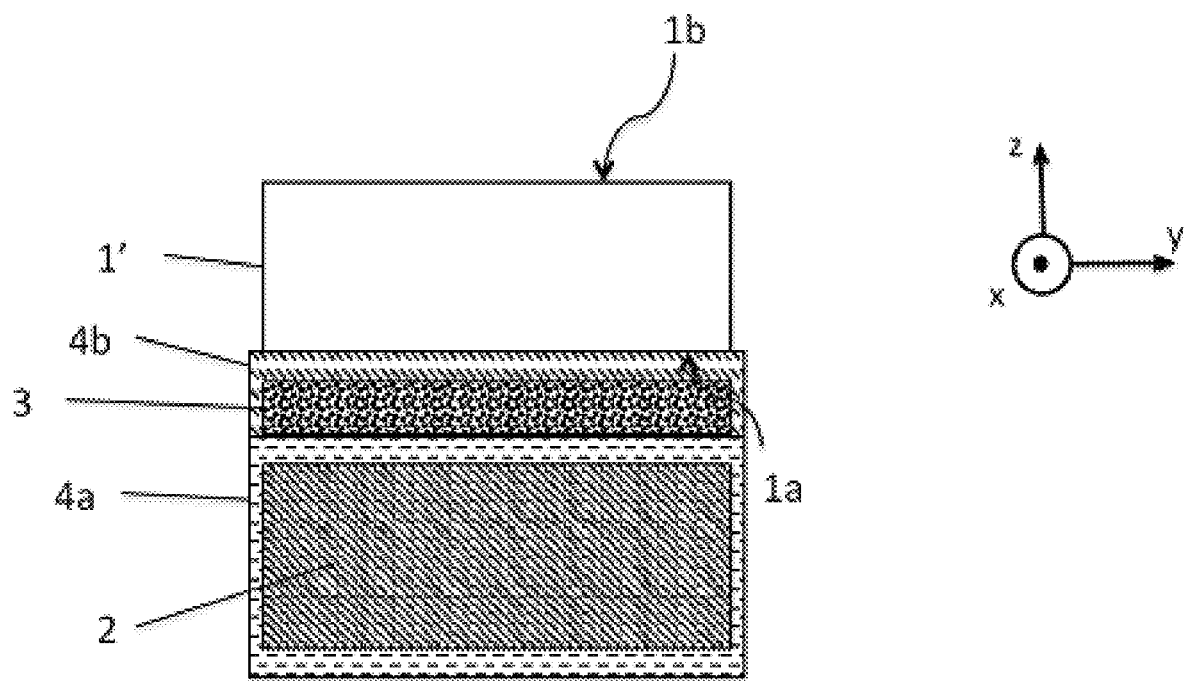

The manufacturing process according to present disclosure comprises a fourth step (denoted by iv)) comprising the assembling of the working layer 1 (or of the donor substrate 1') and of the support substrate 2, so that the sintered composite layer 3 is positioned between the working layer 1 and the support substrate 2 (FIG. 5D).

Preferentially, a bonding layer 4b is deposited on the composite layer 3, prior to the assembly step iv). By way of example, a layer of silicon oxide could be deposited on the free surface of the composite layer 3. This bonding layer 4b provides, on the one hand, an encapsulation of the sintered composite layer 3, avoiding or at least limiting the risks of contamination between the various layers of the hybrid structure 10; on the other hand, the bonding layer 4b may be advantageous for allowing a conventional surface preparation that is not specific to the composition of the sintered composite layer 3.

Preferentially, the assembly step is carried out by direct bonding, by molecular adhesion, of the two surfaces brought into contact: i.e., of the first face 1a of the working layer 1 (or of the donor substrate 1') and of the free face of the composite layer 3 in the example from FIG. 5C. The principle of molecular adhesion, well known in the prior art, will not be described in further detail here.

Alternatively, the assembly could be carried out by addition of a layer of adhesive material, or by any other bonding technique suitable for the intended application.

For most assembly processes, a good surface finish (cleanliness, low roughness, etc.) of the substrates to be assembled will be required.

Figure 5E:
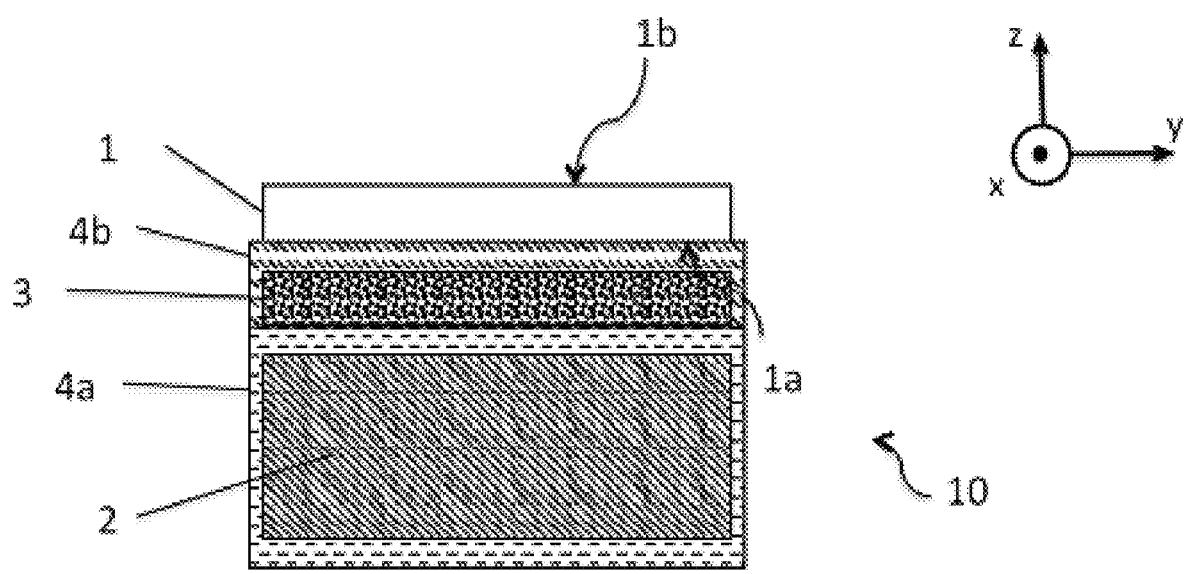

The manufacturing process according to the present disclosure may further comprise a fifth step (denoted by v)) comprising the thinning of the donor substrate 1' to the desired thickness of the working layer 1 for the manufacture of the acoustic wave device (FIG. 5E). This step could, for example, comprise mechanical grinding followed by dry or chemical-mechanical polishing, making it possible to ensure a good surface finish of the working layer 1. Various cleaning sequences could be applied during or after the thinning step in order to guarantee the quality and the cleanliness of the final hybrid structure 10.

The thinning of the donor substrate 1' to obtain the working layer 1 could be carried out by any other known technique, in particular, the SMART CUT® process or other techniques for producing thin layers.

Of course, the present disclosure is not limited to the described embodiments and examples and variant embodiments may be into therefrom without departing from the scope of the invention such as defined by the claims.

The invention claimed is:

1. A hybrid structure for a surface acoustic wave device, comprising:
   a support substrate;
   a working layer of piezoelectric material assembled with the support substrate, the support substrate having a lower coefficient of thermal expansion than a coefficient of thermal expansion of the working layer; and
   an intermediate layer located between the working layer and the support substrate, the intermediate layer comprising a composite layer comprising grains of at least a first material and a second material different from the first material, the grains of the first material and second material being fused together to form the composite layer.

2. The hybrid structure of claim 1, wherein:
   the first material has a similar acoustic impedance to an acoustic impedance of the working layer;
   a ratio between an acoustic impedance of the working layer and the acoustic impedance of the second material is greater than 2; and
   a mean size of particles of the grains of the first material and the second material is greater than or equal to a quarter of a wavelength of an acoustic signal to be propagated at a surface of the surface acoustic wave device.

3. The hybrid structure of claim 1, wherein:
   the first material and the second material are selected so as to form an acoustic impedance matching layer between the working layer and the support substrate; and
   a mean size of particles of the grains of the first material and the second material is less than a quarter of a wavelength of an acoustic signal to be propagated at a surface of the surface acoustic wave device.

4. The hybrid structure of claim 1, wherein the support substrate comprises at least one material selected from among the group consisting of: silicon, glass, silica, sapphire, alumina, and aluminum nitride.

5. The hybrid structure of claim 1, wherein the working layer comprises at least one piezoelectric material selected from among the group consisting of: lithium tantalate, lithium niobate, quartz, and zinc oxide.

6. The hybrid structure of claim 1, wherein the first and second materials are selected from among the group consisting of: silicon oxide, silicon nitride, silicon, silicon carbide, alumina, germanium, sapphire, and zirconium.

* * * * *